United States Patent
Yang et al.

(10) Patent No.: US 10,242,609 B2
(45) Date of Patent: Mar. 26, 2019

(54) BARRIER TYPE NAKED-EYE 3D DISPLAY SCREEN AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Ming Yang, Beijing (CN); Xiaochuan Chen, Beijing (CN); Pengcheng Lu, Beijing (CN); Wenqing Zhao, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 88 days.

(21) Appl. No.: 15/149,482

(22) Filed: May 9, 2016

(65) Prior Publication Data

US 2017/0084213 A1 Mar. 23, 2017

(30) Foreign Application Priority Data

Sep. 21, 2015 (CN) .......................... 2015 1 0604118

(51) Int. Cl.
  *G09G 3/00* (2006.01)
  *G09G 3/3208* (2016.01)
  (Continued)

(52) U.S. Cl.
  CPC ......... *G09G 3/003* (2013.01); *G02B 27/2214* (2013.01); *G02F 1/1368* (2013.01);
  (Continued)

(58) Field of Classification Search
  CPC ................ G09G 3/003; G02B 27/2214; G02F 1/133512; G02F 1/133528
  See application file for complete search history.

(56) References Cited

U.S. PATENT DOCUMENTS 6,703,988 B1 * 3/2004 Fergason ........... G02B 27/2235
  345/4
9,599,830 B2 * 3/2017 Wu ..................... G02B 27/2228
(Continued)

FOREIGN PATENT DOCUMENTS

CN    1834729 A    9/2006
CN    103760677 A   4/2014
(Continued)

OTHER PUBLICATIONS

Office Action from corresponding Chinese Application No. 201510604118.X, dated Dec. 29, 2016 (7 pages).
(Continued)

*Primary Examiner* — Ricardo Osorio
(74) *Attorney, Agent, or Firm* — Harness, Dickey & Pierce, P.L.C.

(57) ABSTRACT

The present disclosure discloses a barrier type naked-eye 3D display screen and a display device. The barrier type naked-eye 3D display screen comprises an OLED screen and a liquid crystal screen, a light emergent surface of the OLED screen facing a light incident surface of the liquid crystal screen, wherein the liquid crystal screen comprises a color film substrate having no color resist; the OLED screen comprises a color OLED array serving as a luminous layer thereof, and a drive array connected to and driving the luminous layer so that the OLED screen can produce alternately dark and bright color fringes, which can form a first color image and a second color image having a parallax via the liquid crystal screen, to form a 3D image.

16 Claims, 3 Drawing Sheets

(51) Int. Cl.
  *G09G 3/36* (2006.01)
  *G02F 1/1335* (2006.01)
  *G02F 1/1343* (2006.01)
  *G02F 1/1368* (2006.01)
  *G02B 27/22* (2018.01)
  *H01L 27/32* (2006.01)
  *H01L 51/52* (2006.01)
  *G02F 1/1333* (2006.01)

(52) U.S. Cl.
  CPC .. *G02F 1/133512* (2013.01); *G02F 1/133528* (2013.01); *G02F 1/134309* (2013.01); *G09G 3/3208* (2013.01); *G09G 3/3648* (2013.01); *H01L 27/322* (2013.01); *H01L 27/3211* (2013.01); *H01L 27/3232* (2013.01); *H01L 27/3267* (2013.01); *H01L 27/3286* (2013.01); *H01L 51/5284* (2013.01); *G02F 2001/133302* (2013.01); *G02F 2001/134345* (2013.01); *G02F 2202/28* (2013.01); *G09G 2300/023* (2013.01)

(56) References Cited

U.S. PATENT DOCUMENTS

| | | | | |
|---|---|---|---|---|
| 2003/0042401 A1* | 3/2003 | Gartner | G01B 11/245 | 250/208.1 |
| 2003/0086167 A1* | 5/2003 | Sonehara | G02B 27/2214 | 359/471 |
| 2006/0043400 A1* | 3/2006 | Erchak | H01L 33/20 | 257/98 |
| 2007/0058127 A1* | 3/2007 | Mather | G02B 27/2214 | 349/159 |
| 2008/0144174 A1* | 6/2008 | Lucente | G02B 27/2214 | 359/463 |
| 2010/0103276 A1* | 4/2010 | Border | H04N 13/0207 | 348/222.1 |
| 2010/0328355 A1* | 12/2010 | Fukushima | G02B 27/2214 | 345/690 |
| 2011/0018993 A1* | 1/2011 | Wang | H04N 5/23212 | 348/135 |
| 2011/0316764 A1* | 12/2011 | Parry-Jones | G02B 26/005 | 345/60 |
| 2012/0133651 A1* | 5/2012 | Schmidt | H04N 13/0011 | 345/419 |
| 2012/0256974 A1* | 10/2012 | Minami | G02B 6/0058 | 345/690 |
| 2013/0293534 A1* | 11/2013 | Sato | H04N 13/361 | 345/419 |
| 2014/0036529 A1* | 2/2014 | Suzuki | G02B 6/0053 | 362/606 |
| 2014/0140094 A1* | 5/2014 | Miyao | G02B 6/0055 | 362/609 |
| 2014/0198279 A1* | 7/2014 | Yang | G02B 6/0011 | 349/62 |
| 2014/0204611 A1* | 7/2014 | Yang | G02B 6/0038 | 362/611 |
| 2014/0268867 A1 | 9/2014 | Fiorentino et al. | | |
| 2014/0301108 A1* | 10/2014 | Mineura | H04N 5/66 | 362/615 |
| 2014/0327710 A1* | 11/2014 | Xu | G09G 3/003 | 345/698 |
| 2014/0355113 A1* | 12/2014 | Pan | G02B 27/2214 | 359/462 |
| 2015/0091886 A1* | 4/2015 | Quan | G02B 27/2214 | 345/212 |
| 2015/0309245 A1* | 10/2015 | Jeon | G02B 6/0036 | 359/462 |
| 2017/0070728 A1* | 3/2017 | Kim | H04N 13/128 | |
| 2018/0129061 A1* | 5/2018 | Shinohara | G02B 6/122 | |

FOREIGN PATENT DOCUMENTS

| | | |
|---|---|---|
| CN | 104064658 A | 9/2014 |
| CN | 104849869 A | 8/2015 |

OTHER PUBLICATIONS

Office Action from corresponding Chinese Application No. 201510604118.X, dated Jul. 13, 2017 (17 pages).

* cited by examiner

BARRIER TYPE NAKED-EYE 3D DISPLAY SCREEN AND DISPLAY DEVICE

CROSS-REFERENCE TO RELATED APPLICATION

This application claims the benefit and priority of Chinese Patent Application No. 201510604118. X filed Sep. 21, 2015. The entire disclosure of the above application is incorporated herein by reference.

FIELD

The present disclosure relates to the field of 3D display techniques, and particularly, to a barrier type naked-eye 3D display screen and a display device.

BACKGROUND

This section provides background information related to the present disclosure which is not necessarily prior art.

The naked-eye three-dimensional (3D) display techniques enable people to view vivid stereo images without wearing the 3D glasses. Those techniques release the wearers from the bondage of the traditional 3D glasses, and fundamentally solve the problem of dizziness caused by the long-time wearing of the 3D glasses, thereby greatly improving people's viewing comfortability. According to different display principles, the naked-eye 3D display techniques can be classified into the grating-type (i. e. parallax barrier) naked-eye 3D display technique and the lenticular lens 3D display technique. The display device based on the grating-type naked-eye 3D display technique attracts people's extensive attention due to the advantages of simple manufacturing procedure, small crosstalk and low production cost. Such display device generates alternately dark and bright fringes through a parallax barrier provided between a backlight module and a liquid crystal screen, and the parallax barrier functions as a grating. The light coming from each bright fringe passes through the liquid crystal screen in two angles to form a left view entering the viewer's left eye and a right view entering the viewer's right eye, respectively. Thus the left view and the right view seen by the viewer's two eyes have a parallax. After a superposition and reproduction of the left view and the right view having a parallax in the viewer's brain, the viewer can see a 3D display image with naked eyes.

However, in the above grating-type naked-eye 3D display device, a parallax barrier needs to be arranged between the backlight module and the liquid crystal screen, which increases the thickness of the 3D display device. In addition, a color resist is provided in the color film substrate of the liquid crystal screen, which decreases the transmittance and seriously affects the image display brightness of the naked-eye 3D display device.

SUMMARY

This section provides a general summary of the disclosure, and is not a comprehensive disclosure of its full scope or all of its features.

The embodiments described herein provide a barrier type naked-eye 3D display screen and a display device, so as to increase the display brightness of the stereo color image while decreasing the thickness of the barrier type naked-eye 3D display screen.

In one embodiment, a barrier type naked-eye 3D display screen comprises an OLED (Organic Light-Emitting Diode) screen and a liquid crystal screen, a light emergent surface of the OLED screen being facing a light incident surface of the liquid crystal screen. The liquid crystal screen comprises a color film substrate having no color resist. The OLED screen comprises a color OLED array serving as a luminous layer thereof, and a drive array connected to and driving the luminous layer so that the OLED screen can produce alternately dark and bright color fringes. Each of the color bright fringes forms a first color image entering one eye of a viewer and a second color image entering the other eye of the viewer, respectively, via the color film substrate on the liquid crystal screen, so as to generate a 3D image.

In one example, the color film substrate comprises a first glass substrate, and a black matrix provided on a side of the first glass substrate close to a liquid crystal layer of the liquid crystal screen.

In one example, the drive array includes array-distributed drive units, and every N columns of drive units are taken as a drive unit group, one of two adjacent drive unit groups drives the OLED screen to form a color bright fringe, and the other drive unit group drives the OLED screen to form a dark fringe adjacent to the color bright fringe, and wherein N is an integer.

In one example, the color film substrate includes array-distributed subpixel units, every N columns of subpixel units are taken as a subpixel unit group, one of two adjacent subpixel unit groups forms the color bright fringe, through which human eyes can view the first color image and the second color image, respectively, and the other of the two adjacent subpixel unit groups forms the dark fringe adjacent to the color bright fringe, for preventing any unrelated color image from entering the human eyes.

In one example, the value of N ranges from 1 to 3.

In one example, each color OLED unit in the color OLED array comprises a red OLED subpixel, a green OLED subpixel and/or a blue OLED subpixel.

In one example, the OLED screen is an active OLED screen or a passive OLED screen.

In one example, the light emergent surface of the OLED screen is bonded with the light incident surface of the liquid crystal screen through a transparent bonding layer.

In one example, a bonding agent used in the transparent bonding layer includes optical transparent glue.

In one example, the OLED screen further comprises an OLED substrate and a second glass substrate, between which the color OLED array is located.

In one example, the liquid crystal screen further comprises a lower polarizer, a TFT array substrate, a liquid crystal layer and an upper polarizer arranged in stack.

In another embodiment, a display device comprises a barrier type naked-eye 3D display screen, which includes an OLED screen and a liquid crystal screen, a light emergent surface of the OLED screen facing a light incident surface of the liquid crystal screen. The liquid crystal screen comprises a color film substrate having no color resist. The OLED screen comprises a color OLED array serving as a luminous layer thereof, and a drive array connected to and driving the luminous layer so that the OLED screen can produce alternately dark and bright color fringes. Each of the color bright fringes forms a first color image entering one eye of a viewer and a second color image entering the other eye of the viewer, respectively, through a color film substrate on the liquid crystal screen, so as to generate a 3D image.

According to the barrier type naked-eye 3D display screen provided by the embodiment described herein, the luminous layer in the OLED screen is the color OLED array, each color OLED unit of which can emit color light under the driving of current. Through the control of current by the drive array of the OLED screen, the luminous layer may be driven so that the OLED screen emits alternately dark and bright color fringes. Each color bright fringe forms the first color image entering one eye of the viewer and the second color image entering the other eye of the viewer, respectively, via the color film substrate on the liquid crystal screen. Since each color bright fringe forms the first color image and the second color image in different emergent angles, the barrier type naked-eye display screen provided by the embodiment described herein enables the two eyes of the viewer to receive the first color image and the second color image having a parallax, respectively. According to the principle of the 3D display technique, after the superposition and reproduction of the first color image and the second color image having a parallax in the brain, a stereo color image can be generated. Thus, in the barrier type naked-eye 3D display screen provided by the embodiment described herein, although the color film substrate of the liquid crystal screen is not filled with any color resist, the colorized stereo image still can be achieved by way of color light emitted from the color array in the luminous layer of the OLED screen.

According to the above analysis, the colorized stereo image is actually achieved by way of the color light emitted from the luminous layer of the OLED screen, and it is unnecessary to provide a special color film substrate in the OLED screen, and also unnecessary to fill a color resist in the color film substrate of the liquid crystal screen. Thus in the barrier type naked-eye 3D display screen provided by the embodiment described herein, the color light emitted from the luminous layer of the OLED screen is not filtered by the color resist during transmission, and the display brightness of the formed stereo color image is thus largely increased.

Moreover, in the barrier type naked-eye 3D display screen provided by the embodiment described herein, by using the characteristics of self-illumination and production of alternately dark and bright color fringes of the OLED screen, the functions of the backlight module and the parallax barrier are integrated and the OLED screen and the liquid crystal screen are combined to avoid adding any single parallax barrier, thereby decreasing the thickness of the barrier type naked-eye 3D display screen.

Further aspects and areas of applicability will become apparent from the description provided herein. It shall be understood that various aspects of the embodiments described herein may be implemented individually or in combination with one or more other aspects. It shall also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings.

Figure 1:
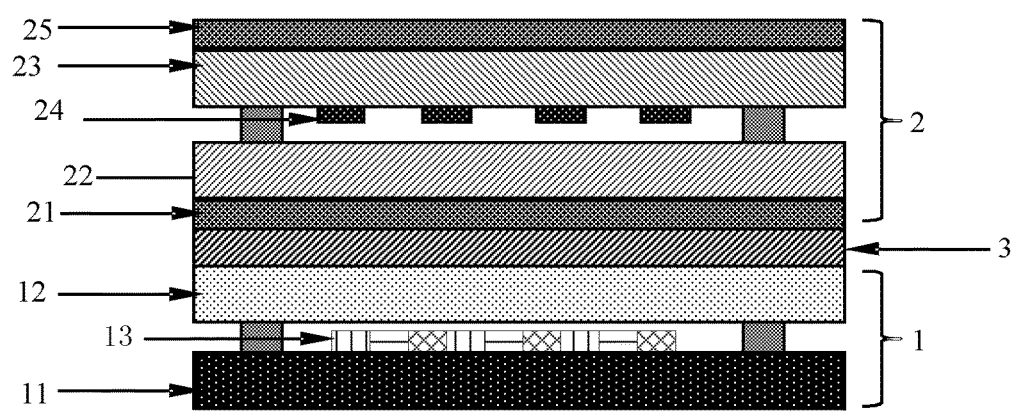
FIG. 1 is a structure diagram of an exemplary barrier type naked-eye 3D display screen.

As illustrated in FIG. 1, the barrier type naked-eye 3D display screen provided by an exemplary embodiment comprises an OLED screen 1 and a liquid crystal screen 2, a light emergent surface of the OLED screen 1 being arranged to face a light incident surface of the liquid crystal screen 2. The liquid crystal screen 2 comprises a color film substrate having no color resist. The OLED screen 1 comprises a color OLED array serving as a luminous layer 13, and a drive array connected to and driving the luminous layer 13 so that the OLED screen 1 produces alternately dark and bright color fringes. Each of the color bright fringes forms a first color image I entering one eye of a viewer and a second color image II entering the other eye of the viewer, respectively, via a color film substrate on the liquid crystal screen 2, so as to generate a stereo color image, i. e. , a 3D image.

To be noted, the pixels (counted in columns) on the color film substrate of the liquid crystal screen 2, which are corresponding to the same color bright fringe and used to form the first color image I and the second color image II are adjacent to each other.

In the barrier type naked-eye 3D display screen provided by the exemplary embodiment described herein, the luminous layer 13 in the OLED screen 1 is the color OLED array, each color OLED unit of which can emit color light under the driving of current. Through the control of current by the drive array of the OLED screen 1, the luminous layer 13 may be driven so that the OLED screen 1 emits alternately dark and bright color fringes. Each color bright fringe forms the first color image I entering one eye of the viewer and the second color image II entering the other eye of the viewer, respectively, via the color film substrate on the liquid crystal screen 2. Since each color bright fringe forms the first color image I and the second color image II in different emergent angles, the barrier type naked-eye display screen provided by the exemplary embodiment described herein enables the two eyes of the viewer to receive the first color image I and the second color image II having a parallax. According to the principle of the 3D display technique, after the superposition and reproduction of the first color image I and the second color image II having a parallax in the brain, a stereo color image can be generated. Thus, in the barrier type naked-eye 3D display screen provided by the exemplary embodiments described herein, although the color film substrate of the liquid crystal screen 2 is not filled with any color resist, the colorized stereo image still can be achieved by way of color light emitted from the color array in the luminous layer of the OLED screen.

According to the above analysis, the colorized stereo image is actually achieved by way of the color light emitted from the luminous layer 13 of the OLED screen 1, and it is unnecessary to provide a special color film substrate in the OLED screen 1, or and also unnecessary to fill a color resist in the color film substrate of the liquid crystal screen 2. Thus in the barrier type naked-eye 3D display screen provided by the exemplary embodiments described herein, the color light emitted from the luminous layer 13 of the OLED screen 1 is not filtered by the color resist during transmission, and the display brightness of the formed stereo color image is thus largely increased.

Moreover, in the barrier type naked-eye 3D display screen provided by the exemplary embodiments described herein, by using the characteristics of self-illumination and production of alternately dark and bright color fringes of the OLED screen 1, the functions of the backlight module and the parallax barrier are integrated and the OLED screen 1 and the liquid crystal screen 2 are combined to avoid adding any single parallax barrier, thereby decreasing the thickness of the barrier type naked-eye 3D display screen.

In a specific example, the OLED screen 1 of the barrier type naked-eye 3D display screen provided by the exemplary embodiments described herein may comprise an OLED substrate 11 and a second glass substrate 12, between which said color OLED array and a drive array for driving the color OLED array to emit light are provided. The color OLED array comprises array-distributed color OLED units, and the frames of the OLED substrate 11 and the second glass substrate 12 are sealed with frame-sealing glue. The liquid crystal screen 2 comprises a lower polarizer 21, a TFT array substrate 22, a first glass substrate 23 and an upper polarizer 25 arranged in track. A liquid crystal layer is provided between the first glass substrate 23 and the TFT array substrate 22, and a surface of the first glass substrate 23 facing the liquid crystal layer is provided with a black matrix 24. The first glass substrate 23 and the black matrix 24 form said color film substrate, and the first glass substrate 23 and the TFT array substrate 22 seal the liquid crystal in a frame through frame-sealing glue.

The light emergent surface of the OLED screen 1 is a surface of the second glass substrate 12 facing the liquid crystal screen 2, and the light incident surface of the liquid crystal screen 2 is a surface of the lower polarizer 21. In order to connect the second glass substrate 12 with the lower polarizer 21 so that the OLED screen 1 and the liquid crystal screen 2 form the barrier type naked-eye 3D display screen, a transparent bonding layer 3 is usually provided between the second glass substrate 12 and the lower polarizer 21 to bond them. In the exemplary embodiments described herein, the transparent bonding layer 3 may be made of a variety of materials, for example an optical transparent adhesive, but not excluding other bondable transparent material.

To be emphasized, in the liquid crystal screen 2 provided in the embodiments of the present disclosure, the first glass substrate 23 and the black matrix 24 provided on the surface of the first glass substrate 23 facing the liquid crystal layer form the color film substrate, i. e. , the color film substrate described in the exemplary embodiments of the present disclosure may not include a color resist. A colorized image can be obtained by means of the color OLED array in the OLED screen 1, rather than the color resist, so the brightness of the displayed image can be increased.

To be noted, although the above embodiments describes the specific structures of the OLED screen 1 and the liquid crystal screen 2, the barrier type naked-eye 3D display screen may also be formed with the OLED screen 1 and the liquid crystal screen 2 of similar structures.

In order to more clearly explain how the drive array in the OLED screen 1 drives the luminous layer 13 to produce the alternately dark and bright color fringes, the driving mode of the drive array of the OLED screen 1 will be further described as follows.

The drive array includes array-distributed drive units, and every N columns of drive units are taken as a drive unit group. One of two adjacent drive unit groups drives the OLED screen 1 to form a color bright fringe, and the other drive unit group drives the OLED screen 1 to form a dark fringe adjacent to the color bright fringe. In one embodiment, in order to fit the transmission of the alternately dark and bright color fringes produced by the OLED screen 1 in the optical path, every N columns of subpixel units included in the color film substrate are taken as a subpixel unit group, wherein one of two adjacent subpixel unit groups causes one of the color bright fringes to form the first color image I, and the other group causes the same color bright fringe to form the second color image II.

In the embodiments of the present disclosure, N is an integer. In an alternative embodiment, the value of N ranges from 1 to 3. It can be understood that the value of N is related to factors such as the area of the screen, the area of each column of color OLED units in the color OLED array, etc. Although the value range of N is given, the value of N still shall be selected upon the actual demand.

Next, the formation principles of the 3D image in the cases where N=1 and N=3 will be exemplarily analyzed, and the following embodiments are just for the purpose of explanations, rather than limitations to the value of N.

Embodiment 1

This embodiment describes the formation principle of the 3D image on the barrier type naked-eye 3D display screen provided by the above embodiments when N=1.

Figure 2:
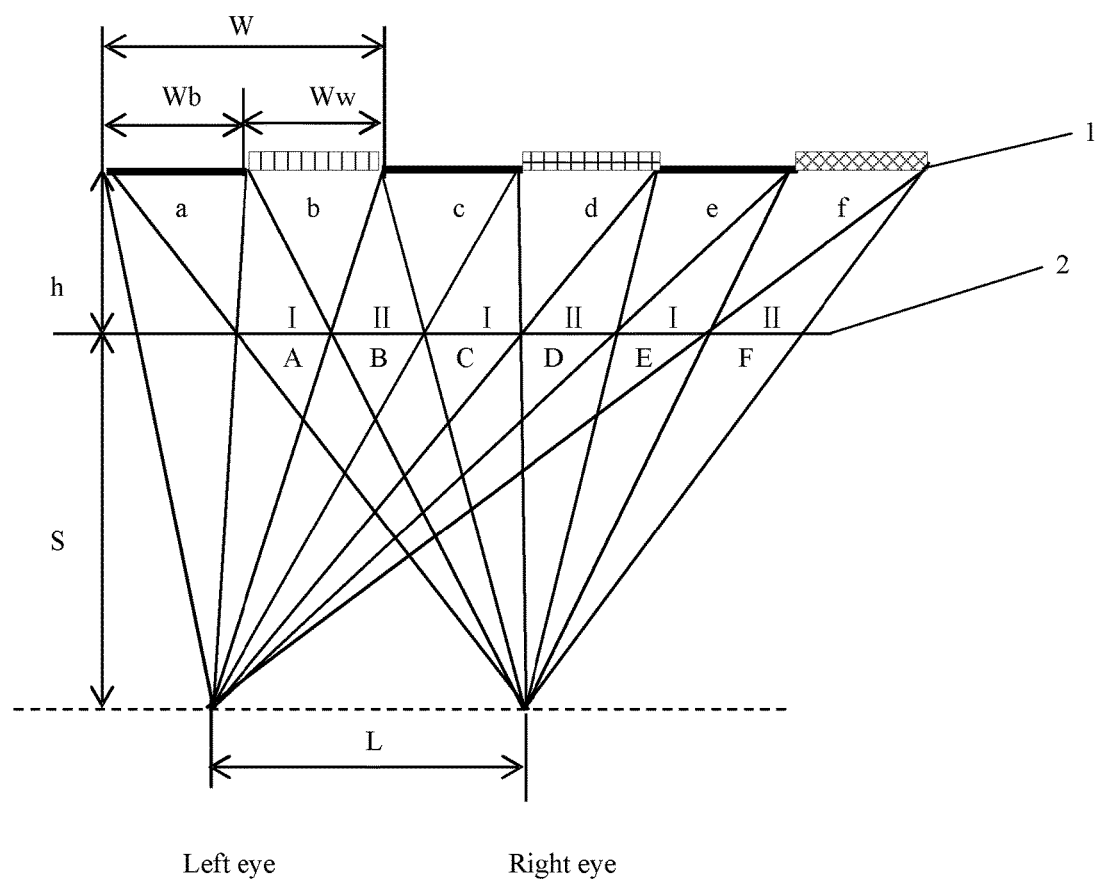
FIG. 2 is a schematic diagram of a first working principle of a barrier type naked-eye 3D display screen provided by an embodiment of the present disclosure.

As described in the above embodiments, the OLED screen 1 shown in FIG. 1 serves as a grating, the liquid crystal screen 2 serves as a 2D display, and the light emergent surface of the OLED screen 1 is joined with the light incident surface of the liquid crystal screen 2 to form a barrier type naked-eye 3D display screen. As illustrated in FIG. 2, a distance from the luminous layer 13 in the OLED screen 1 to the pixel array in the color film substrate of the liquid crystal screen 2 is h, a distance from either eye of the viewer to the light emergent surface of the liquid crystal screen 2 is S, and a distance between the pupils of the two eyes of the viewer is L.

Further as illustrated in FIG. 2, the luminous layer 13 of the OLED screen 1 comprises six columns of continuous color OLED subpixels a, b, c, d, e and f, and correspondingly, the color film substrate of the liquid crystal screen 2 comprises six columns of subpixel units A, B, C, D, E and F formed by the black matrix.

During operations, the color OLED array of the OLED screen 1 functions as both a light source and a grating. Specifically, three columns of color OLED subpixels a, c and e are not controlled by three columns of drive units of the OLED screen (not illustrated), thus the color OLED subpixels a, c and e do not emit light to form three dark fringes; while three columns of color OLED subpixel b, d and f are controlled by drive units adjacent to the above three columns of drive units of the OLED screen, respectively, to form three color bright fringes. With respect to the three color bright fringes correspondingly formed by the three columns of color OLED subpixel b, d and f, the first color image I correspondingly formed by the three columns of subpixel units A, C and E on the color film substrate enters the left eye. Meanwhile, with respect to the three color bright fringes correspondingly formed by the three columns of color OLED subpixel b, d and f, the second color image II correspondingly formed by the three columns of subpixel units B, D and F on the color film substrate enters the right eye.

According to the above analysis, when N=1,the three dark fringes are correspondingly formed by the three columns of color OLED subpixels a, c and e, while the three color bright fringes are correspondingly formed by the three columns of color OLED subpixel b, d and f. Thus in the color OLED array serving as a grating, each of the three columns of color OLED subpixels a, c and e is corresponding to a grating shading portion with a width of Wb, and each of the three columns of color OLED subpixel b, d and f is corresponding to a grating transmitting portion with a width of Ww.

In addition, in the color OLED array serving as a grating, the grating period is a sum of the widths of adjacent grating shading portion and grating transmitting portion. Thus when N=1,the grating period actually covers two adjacent columns of color OLED subpixels, i.e. , W=Wb+Ww.

Embodiment 2

This embodiment describes the formation principle of the 3D image on the barrier type naked-eye 3D display screen provided by the above embodiments when N=3.

Figure 3:
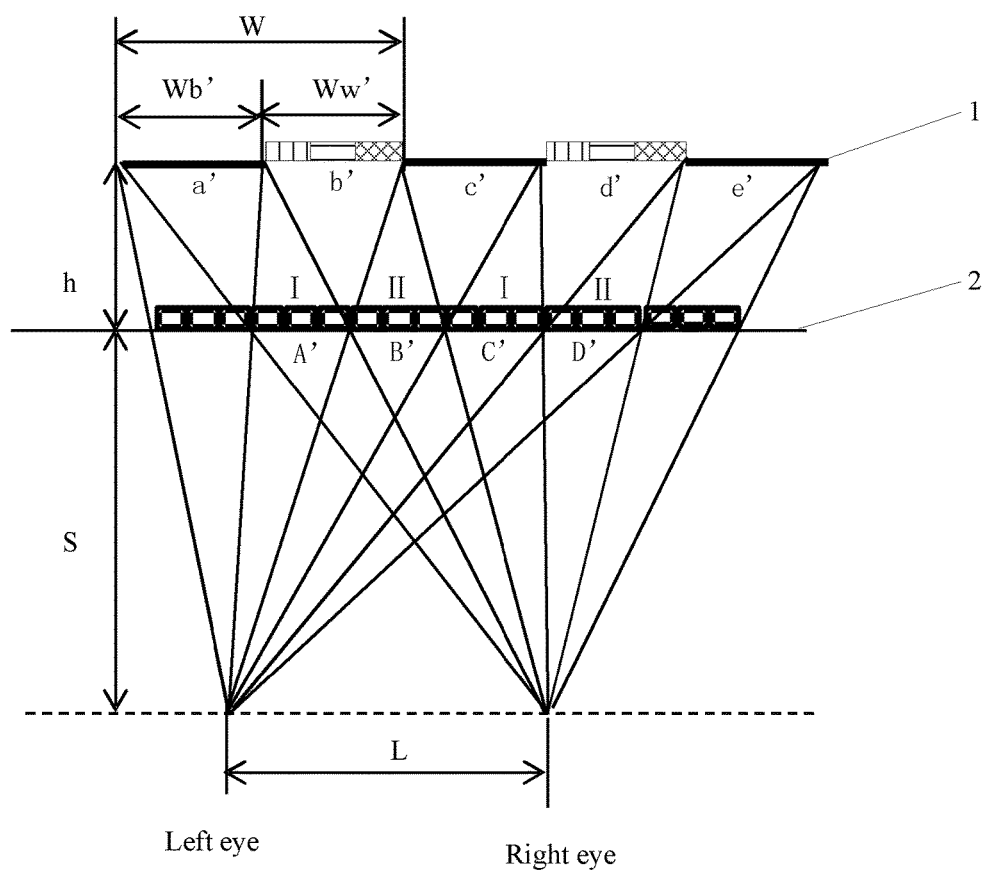
FIG. 3 is a schematic diagram of a second working principle of a barrier type naked-eye 3D display screen provided by an embodiment of the present disclosure.

As described in the above embodiments, the OLED screen 1 shown in FIG. 1 serves as a grating, the liquid crystal screen 2 serves as a 2D display, and the light emergent surface of the OLED screen 1 is joined with the light incident surface of the liquid crystal screen 2 to form a barrier type naked-eye 3D display screen. As illustrated in FIG. 3, a distance from the luminous layer 13 in the OLED screen 1 to the pixel array in the color film substrate of the liquid crystal screen 2 is h, a distance from either eye of the viewer to the light emergent surface of the liquid crystal screen 12 is S, and a distance between the pupils of the two eyes of the viewer is L.

Further as illustrated in FIG. 3, the luminous layer 13 of the OLED screen 1 comprises five color OLED subpixel unit groups a', b', c', d' and e', and each color OLED subpixel unit group includes three columns of color OLED subpixel units. Each column color OLED subpixel units in color OLED subpixel unit group may be controlled by the drive unit. Correspondingly, the color film substrate of the liquid crystal screen 2 comprises four subpixel unit groups A', B', C' and D' formed by the black matrix, each subpixel unit groups includes three columns of subpixel units.

During operations, the color OLED array of the OLED screen 1 functions as both a light source and a grating. Specifically, three color OLED subpixel unit groups a', c' and e' are not controlled by the drive units of the OLED screen (not illustrated), thus the color OLED subpixel groups a', c' and e' do not emit light to form three dark fringes; while two color OLED subpixel groups b' and d' are controlled by the drive units of the OLED screen, and then emit color bright fringes. With respect to the two color bright fringes correspondingly formed by the two color OLED subpixel groups b' and d', the first color image I correspondingly formed by the two pixel unit groups A' and C' on the color film substrate enters the left eye. Meanwhile, with respect to the two color bright fringes correspondingly formed by the two color OLED subpixel groups b' and d', the second color image II correspondingly formed by the two pixel unit groups B' and D' on the color film substrate enters the right eye.

According to the above analysis, when N=3,the three dark fringes are correspondingly formed by the three color OLED subpixel unit groups a', c' and e', while the two color bright fringes are correspondingly formed by the two color OLED subpixel unit groups b' and d'. Thus in the color OLED array serving as a grating, each of the three color OLED subpixel unit groups a', c' and e' is corresponding to a grating shading portion with a width of Wb', and each of the two color OLED subpixel unit groups b' and d' is corresponding to a grating transmitting portion with a width of Ww'.

In addition, in the color OLED array serving as a grating, the grating period is a sum of the widths of adjacent grating shading portion and grating transmitting portion. Thus when N=3,the grating period is W=Wb'+Ww'.

To be noted, in the above embodiment, an active OLED screen or a passive OLED screen may be selected as the OLED screen 1 according to different driving modes of the drive array.

In one embodiment, each color OLED unit in the color OLED array of the OLED screen 1 may comprise one or more of a red OLED subpixel, a green OLED subpixel and a blue OLED subpixel, not excluding any other color OLED subpixel.

In another embodiment, a display device comprises the barrier type naked-eye 3D display screen of any of the described embodiments.

The beneficial effect of the display device provided by the embodiment described herein is the same as that of the above barrier type naked-eye 3D display screen, and herein is omitted.

The display device provided by the embodiment described herein may be any product or part having a display function, such as a cellular phone, a tablet PC, a television, a display, a notebook computer, a digital photo frame, or a navigator.

In the descriptions of the above embodiments, the specific feature, structure, material or characteristic may be combined in a proper way in any one or more embodiments or examples.

To be pointed out, the drawings could exaggerate the sizes of the layers and areas for clear illustrations. In addition, it shall be understood that when an element or layer is referred to as being "above" another element or layer, it may be directly located on other element, or there may be an intermediate layer; When an element or layer is referred to as being "below" another element or layer, it may be directly located under other element, or there may be one or more intermediate layers or elements; and when an element or layer is referred to as being "between" two layers or elements, it may be an unique layer between the two layers or elements, or there may be one or more intermediate layers or elements. The terms "first" and "second" are only used for the purpose of description, rather than indicating or implying any relative importance.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A barrier type naked-eye 3D display screen, comprising an OLED screen and a liquid crystal screen, a light emergent surface of the OLED screen facing a light incident surface of the liquid crystal screen, wherein the liquid crystal screen comprises a color film substrate having no color resist, wherein the OLED screen comprises a single layer of a color OLED array serving as both a luminous layer and a parallax barrier for 3D display, and a drive array connected to and driving OLEDs of the color OLED array such that some of the OLEDs in the color OLED array emit light to form bright color fringes and serve as the luminous layer, and the remaining OLEDs in the color OLED array, alternately arranged with the OLEDs that emit the light, do not emit light to form dark color fringes which forms the parallax barrier together with the bright color fringes, and wherein each of the color bright fringes forms a first color image entering one eye of a viewer and a second color image entering the other eye of the viewer, respectively, via the color film substrate on the liquid crystal screen, so as to generate a 3D image.

2. The barrier type naked-eye 3D display screen according to claim 1, wherein the color film substrate comprises a first glass substrate and a black matrix provided on a side of the first glass substrate close to a liquid crystal layer of the liquid crystal screen.

3. The barrier type naked-eye 3D display screen according to claim 1, wherein the drive array includes array-distributed drive units, and every N columns of drive units are taken as a drive unit group, one of two adjacent drive unit groups drives the OLED screen to form a color bright fringe, and the other drive unit group drives the OLED screen to form a dark fringe adjacent to the color bright fringe, and wherein N is an integer.

4. The barrier type naked-eye 3D display screen according to claim 3, wherein the color film substrate includes array-distributed subpixel units, every N columns of subpixel units are taken as a subpixel unit group, one of two adjacent subpixel unit groups causes one of the color bright fringes to form the first color image, and the other of the two adjacent subpixel unit groups causes the same color bright fringe to form the second color image.

5. The barrier type naked-eye 3D display screen according to claim 4, wherein the value of N ranges from 1 to 3.

6. The barrier type naked-eye 3D display screen according to claim 1, wherein each color OLED unit in the color OLED array comprises a red OLED subpixel, a green OLED subpixel and/or a blue OLED subpixel.

7. The barrier type naked-eye 3D display screen according to claim 1, wherein the OLED screen is an active OLED screen or a passive OLED screen.

8. The barrier type naked-eye 3D display screen according to claim 1, wherein the light emergent surface of the OLED screen is bonded with the light incident surface of the liquid crystal screen through a transparent bonding layer.

9. The barrier type naked-eye 3D display screen according to claim 8, wherein a bonding agent used in the transparent bonding layer includes optical transparent glue.

10. The barrier type naked-eye 3D display screen according to claim 1, wherein the OLED screen further comprises an OLED substrate and a second glass substrate, between which the color OLED array is located.

11. The barrier type naked-eye 3D display screen according to claim 1, wherein the liquid crystal screen further comprises a lower polarizer, a TFT array substrate, a liquid crystal layer and an upper polarizer arranged in stack.

12. A display device comprising a barrier type naked-eye 3D display screen including an OLED screen and a liquid crystal screen, a light emergent surface of the OLED screen facing a light incident surface of the liquid crystal screen, wherein the liquid crystal screen comprises a color film substrate having no color resist, wherein the OLED screen comprises a single layer of a color OLED array serving as both a luminous layer and a parallax barrier for 3D display, and a drive array connected to and driving OLEDs of the color OLED array such that some of the OLEDs in the color OLED array emit light to form bright color fringes and serve as the luminous layer, and the remaining OLEDs in the color OLED array, alternately arranged with the OLEDs that emit the light, do not emit light to form dark color fringes which forms the parallax barrier together with the bright color fringes, and wherein each of the color bright fringes forms a first color image entering one eye of a viewer and a second color image entering the other eye of the viewer, respectively, through a color film substrate on the liquid crystal screen, so as to generate a 3D image.

13. The display device according to claim 12, wherein the color film substrate comprises a first glass substrate and a black matrix provided on a side of the first glass substrate close to a liquid crystal layer of the liquid crystal screen.

14. The display device according to claim 13, wherein the color film substrate includes array-distributed subpixel units, every N columns of subpixel units are taken as a subpixel unit group, one of two adjacent subpixel unit groups causes one of the color bright fringes to form the first color image, and the other of the two adjacent subpixel unit groups causes the same color bright fringe to form the second color image.

15. The display device according to claim 12, wherein the drive array includes array-distributed drive units, every N columns of drive units are taken as a drive unit group, one of two adjacent drive unit groups drives the OLED screen to form a color bright fringe, and the other drive unit group drives the OLED screen to form a dark fringe adjacent to the color bright fringe, and wherein N is an integer.

16. The display device according to claim 12, wherein each color OLED unit in the color OLED array comprises a red OLED subpixel, a green OLED subpixel and/or a blue OLED subpixel.

* * * * *